(12) United States Patent
Ohkawa et al.

(10) Patent No.: US 7,804,146 B2
(45) Date of Patent: Sep. 28, 2010

(54) SEMICONDUCTOR DEVICE AND METHOD FOR FABRICATING THE SAME

(75) Inventors: Hiroshi Ohkawa, Leuven (BE); Junji Hirase, Osaka (JP); Hisashi Ogawa, Osaka (JP); Kenji Yoneda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/028,392

(22) Filed: Feb. 8, 2008

(65) Prior Publication Data

US 2008/0258229 A1    Oct. 23, 2008

(30) Foreign Application Priority Data

Apr. 18, 2007   (JP) .............................. 2007-108821

(51) Int. Cl.
*H01L 29/76* (2006.01)

(52) U.S. Cl. .............................. 257/411; 257/E29.132; 257/E29.162

(58) Field of Classification Search .................. 257/351, 257/369, 411, 324, 410, E29.132, E29.162
See application file for complete search history.

(56) References Cited

U.S. PATENT DOCUMENTS 6,696,735 B2 * 2/2004 Fukui .......................... 257/410

FOREIGN PATENT DOCUMENTS

JP       2003-31683          1/2003

* cited by examiner

*Primary Examiner*—Quoc D Hoang
(74) *Attorney, Agent, or Firm*—McDermott Will & Emery LLP

(57) ABSTRACT

A semiconductor device includes an N-type MOS transistor and a P-type MOS transistor. The N-type MOS transistor has a first gate insulating film and a first gate electrode. The P-type MOS transistor has a second gate insulating film and a second gate electrode. The first gate insulating film and the second gate insulating film are made of silicon oxynitride, and the first gate insulating film and the second gate insulating film are different from each other in nitrogen concentration profile.

9 Claims, 14 Drawing Sheets

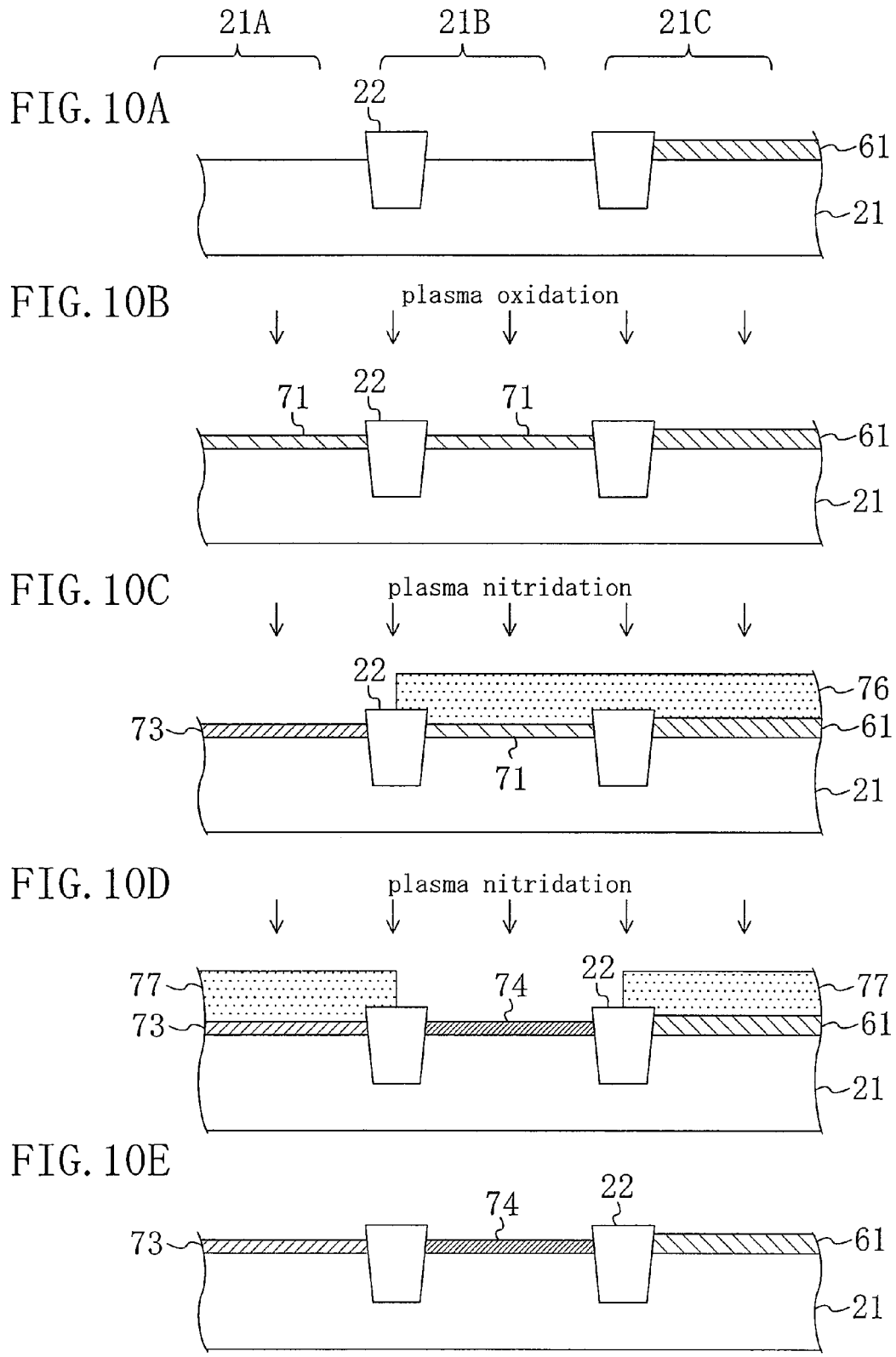

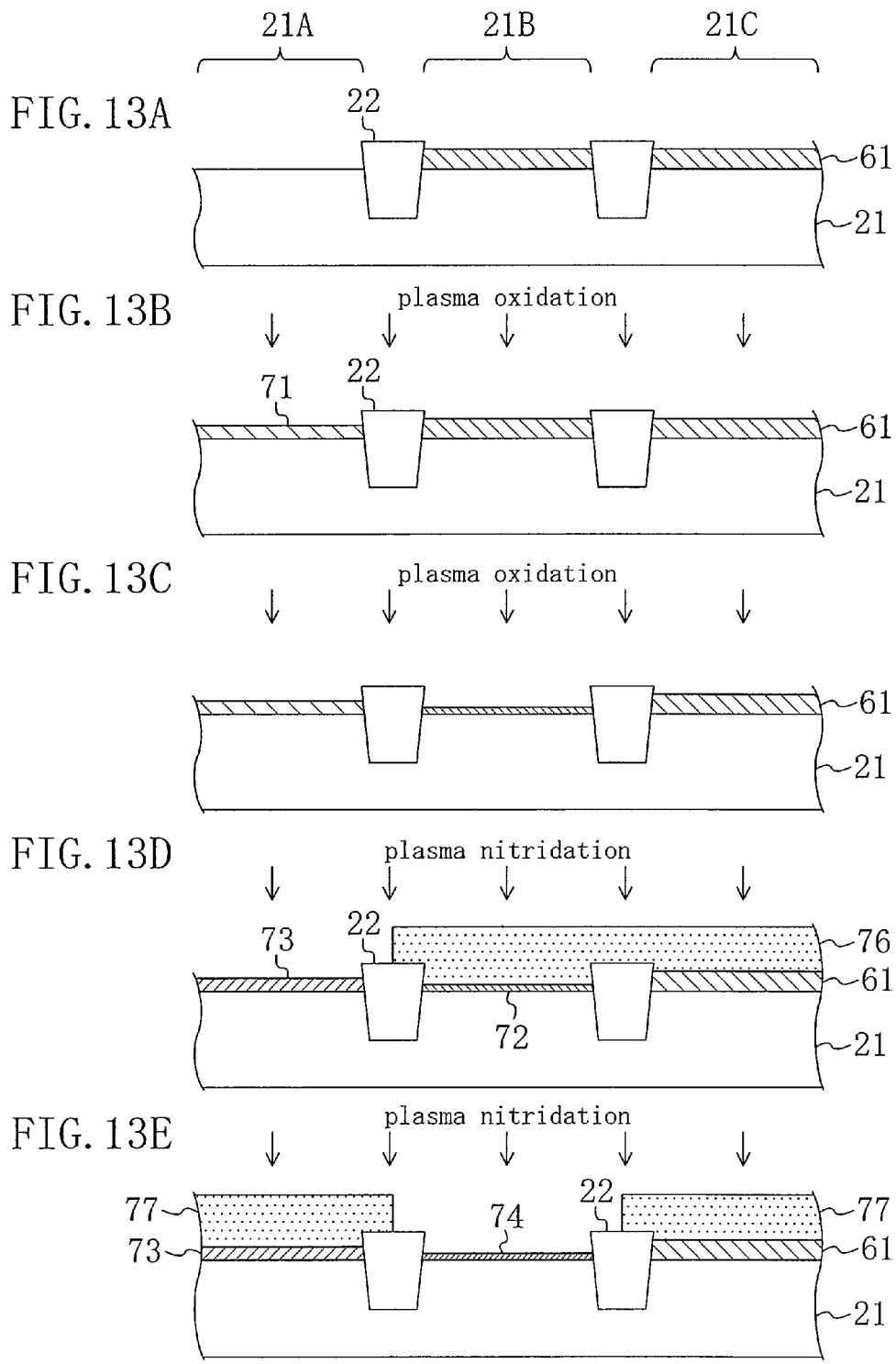

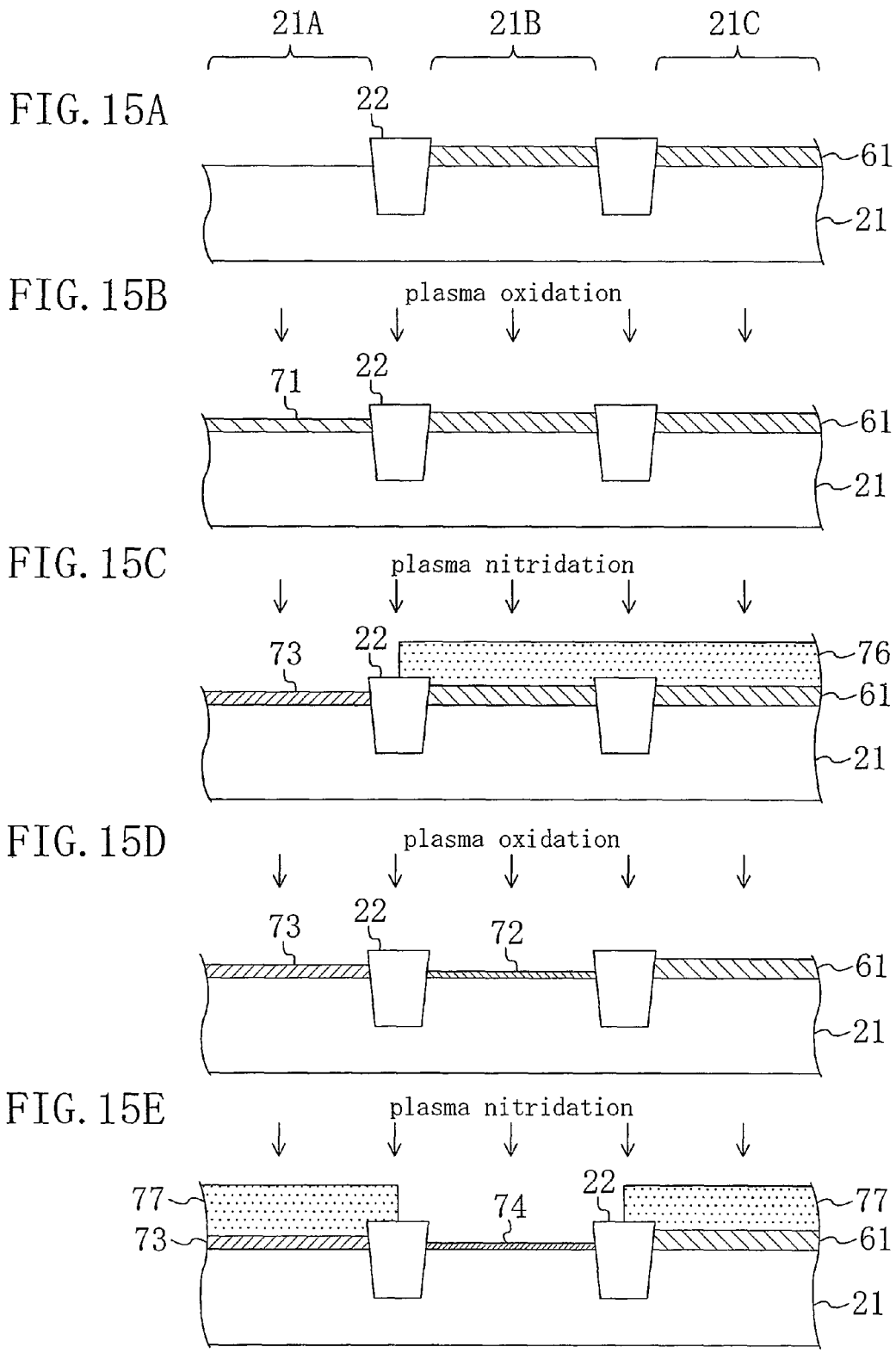

SEMICONDUCTOR DEVICE AND METHOD FOR FABRICATING THE SAME

CROSS-REFERENCE TO RELATED APPLICATION(S)

This application claims priority under 35 U.S.C. §119(a) on Japanese Patent Application No. 2007-108821 filed on Apr. 18, 2007, the entire contents of claims, specification and drawings of which are hereby incorporated by reference.

BACKGROUND OF THE INVENTION

1. Field of the Invention

The present invention relates to a semiconductor device and a method for fabricating the same. Specifically, the present invention relates to a CMOS (Complementary Metal Oxide Semiconductor) device having high drivability and high reliability.

2. Description of the Prior Art

In recent years, as semiconductor integrated circuit devices with an increased degree of integration, a more effective function, and an increased operation speed have been developed, a dual oxide process in which a thick gate insulating film and a thin gate insulating film are formed in one and the same device has been adopted generally (For example, see Japanese Unexamined Patent Publication No. 2003-31683).

FIGS. 16A through 16C illustrate steps of a conventional method for fabricating a semiconductor device having a CMOS device in the order of fabrication. First, as illustrated with FIG. 16A, in a semiconductor substrate 101 such as silicon, a device isolation region 102 is formed by STI (Shallow Trench Isolation). As a result, in the semiconductor substrate 101, an N-type MOS (Metal Oxide Semiconductor) transistor formation region 111, a P-type MOS transistor formation region 112, and a thick-film transistor (N-type MOS transistor) formation region 113 are formed. Subsequently, over the N-type MOS transistor formation region 111, the P-type MOS transistor formation region 112, and the thick-film transistor region 113, a first silicon oxide ($SiO_2$) film 103 having a thickness of between 3 nm and 10 nm is formed. Next, part of the first $SiO_2$ film 103 over the N-type MOS transistor formation region 111 and the P-type MOS transistor formation region 112 is removed using a photosensitive resist as a mask.

Next, as illustrated with FIG. 16B, a second $SiO_2$ film 104 having a thickness of between 1 nm and 3 nm is formed over the N-type MOS transistor formation region 111 and the P-type MOS transistor formation region 112.

Next, as illustrated with FIG. 16C, the first $SiO_2$ film 103 and the second $SiO_2$ film 104 are nitrided to be changed into silicon oxynitride (SiON) films which are a first gate insulating film 105, a second gate insulating film 106, and a third gate insulating film 107.

After this, over the semiconductor substrate 101 having the first gate insulating film 105, the second gate insulating film 106, and the third gate insulating film 107, a polycrystalline silicon film having a thickness of 100 nm is formed. Next, an N-type impurity is implanted into part of the polycrystalline silicon film formed over the N-type MOS transistor formation region 111 and the thick-film transistor formation region 113, and a P-type impurity is implanted into part of the polycrystalline silicon film formed over the P-type MOS transistor formation region 112. After this, by adopting photolithography and RIE (reactive ion etching), the polycrystalline silicon film, the first gate insulating film 105, the second gate insulating film 106, and the third gate insulating film 107 are sequentially etched. This results in the formation of an N-type MOS transistor having the first gate insulating film 105 and a gate electrode over the N-type MOS transistor formation region 111 of the semiconductor substrate 101, a P-type MOS transistor having the second gate insulating film 106 and a gate electrode over the P-type MOS transistor formation region 112 of the semiconductor substrate 101, and a thick-film transistor having the third gate insulating film 107 and a gate electrode over the thick-film transistor formation region 113 of the semiconductor substrate 101, the thick-film transistor being an N-type MOS transistor.

As described above, according to the conventional method, it is possible to form the first gate insulating film 105 of the N-type MOS transistor and the second gate insulating film 106 of the P-type MOS transistor physically thinner in thickness than the third gate insulating film 107 of the thick-film transistor. Moreover, the N-type impurity is implanted into the gate electrode of the N-type MOS transistor and the P-type impurity is implanted into the gate electrode of the P-type MOS transistor, that is, the different impurities are implanted into the gate electrodes. Therefore, the first gate insulating film 105 of the N-type MOS transistor and the second gate insulating film 106 of the P-type MOS transistor are different from each other in electrical thickness. As a result, it is possible to realize gate insulating films which are respectively suitable for the N-type MOS transistor and the P-type MOS transistor.

However, the above-mentioned conventional semiconductor device has problems as follows. According to the conventional method for fabricating a semiconductor device, the N-type impurity is introduced into the gate electrode of the N-type MOS transistor and the P-type impurity is introduced into the gate electrode of the P-type MOS transistor in order that the gate electrode of the N-type MOS transistor and the gate electrode of the P-type MOS transistor may have different work functions. However, the first gate insulating film 105 of the N-type MOS transistor and the second gate insulating film 106 of the P-type MOS transistor are silicon oxynitride films which are formed in the same step, have the same thickness, and have the same nitrogen concentration. Therefore, if the thickness and the nitrogen concentration of the first gate insulating film 105 of the N-type MOS transistor are optimized, optimization of the thickness and the nitrogen concentration of the second gate insulating film 106 of the P-type MOS transistor is insufficient. This results in the problem that the P-type MOS transistor can not obtain an optimal characteristic.

SUMMARY OF THE INVENTION

An object of the present invention is to realize a semiconductor device having high drivability and high reliability in which an N-type MOS transistor and a P-type MOS transistor have gate insulating films with respective optimal characteristics.

To achieve the above-mentioned object, a semiconductor device of the present invention is configured such that a gate insulating film of an N-type MOS transistor and a gate insulating film of a P-type MOS transistor have different nitrogen concentrations and the like.

To be specific, a first semiconductor device according to the present invention includes: a first transistor having a first gate insulating film formed on a first device region of a semiconductor substrate and a first gate electrode formed on the first gate insulating film, the first gate insulating film being made of first silicon oxynitride; and a second transistor having a second gate insulating film formed on a second device region of the semiconductor substrate and a second gate electrode formed on the second gate insulating film, the second gate insulating film being made of second silicon oxynitride, wherein an average of a nitrogen concentration is higher in the first gate insulating film than in the second gate insulating film.

According to the first semiconductor device, it is possible to optimize the first gate insulating film and the second gate insulating film respectively for the first transistor and the second transistor. Therefore, it is possible to realize a semiconductor device including transistors which have gate insulating films with respective optimal characteristics and have high drivability and high reliability.

A second semiconductor device according to the present invention includes: a first transistor having a first gate insulating film formed on a first device region of a semiconductor substrate and a first gate electrode formed on the first gate insulating film, the first gate insulating film being made of first silicon oxynitride; and a second transistor having a second gate insulating film formed on a second device region of the semiconductor substrate and a second gate electrode formed on the second gate insulating film, the second gate insulating film being made of second silicon oxynitride, wherein the first gate insulating film has a thickness greater than the second gate insulating film.

According to the second semiconductor device, it is possible to optimize the first gate insulating film and the second gate insulating film respectively for the first transistor and the second transistor. Therefore, it is possible to realize a semiconductor device including transistors which have gate insulating films with respective optimal characteristics and have high drivability and high reliability.

A method for fabricating the first semiconductor device according to the present invention is directed to a method for fabricating a semiconductor device including a first transistor of first conductivity type and a second transistor of second conductivity type, the method comprising the steps of: (a) forming a first gate insulating film of first silicon oxynitride on a first device region of a semiconductor substrate; (b) forming a second gate insulating film of second silicon oxynitride on a second device region of the semiconductor substrate; and (c) after steps (a) and (b), forming a first gate electrode on the first gate insulating film and a second gate electrode on the second gate insulating film, wherein an average of a nitrogen concentration is higher in the first gate insulating film than in the second gate insulating film.

According to the method for fabricating the first semiconductor device, it is possible to easily form a first gate insulating film and a second gate insulating film which respectively have optimal characteristics. Therefore, it is possible to realize a semiconductor device having gate insulating films which respectively have optimal characteristics and having high drivability and high reliability.

A method for fabricating the second semiconductor device according to the present invention is directed to a method for fabricating a semiconductor device including a first transistor of first conductivity type and a second transistor of second conductivity type, the method comprising the steps of: (a) forming a first gate insulating film of first silicon oxynitride on a first device region of a semiconductor substrate; (b) forming a second gate insulating film of second silicon oxynitride on a second device region of the semiconductor substrate; and (c) after steps (a) and (b), forming a first gate electrode on the first gate insulating film and a second gate electrode on the second gate insulating film, wherein the first gate insulating film has a thickness greater than the second gate insulating film.

According to the method for fabricating the second semiconductor device, it is possible to easily realize a first gate insulating film and a second gate insulating film having different nitrogen concentration profiles. Therefore, it is possible to realize a semiconductor device having gate insulating films which respectively have optimal characteristics and having high drivability and high reliability.

BRIEF DESCRIPTION OF THE DRAWINGS

FIGS. 10A through 10E are cross-sectional views illustrating steps of a method for fabricating a semiconductor device according to Embodiment 3 of the present invention in the order of fabrication.

FIGS. 13A through 13E are cross-sectional views illustrating steps of a method for fabricating a semiconductor device according to Embodiment 4 of the present invention in the order of fabrication in the order of fabrication.

FIGS. 15A through 15E are cross-sectional views illustrating steps of a method for fabricating a semiconductor device according to Embodiment 5 of the present invention in the order of fabrication.

DESCRIPTION OF THE PREFERRED EMBODIMENTS

Embodiment 1

Figure 1:
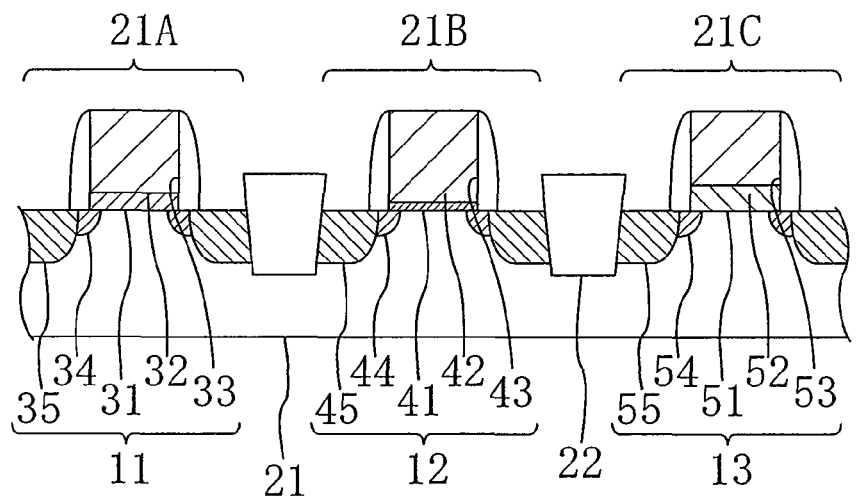
FIG. 1 is a cross-sectional view showing a semiconductor device according to Embodiment 1 of the present invention.

Embodiment 1 of the present invention will be described with reference to the drawings. FIG. 1 shows a cross-sectional configuration in the gate length direction of a semiconductor device having a CMOS (Complementary MOS) device according to Embodiment 1. As shown in FIG. 1, the semiconductor device of the present embodiment includes an N-type MOS transistor 11, a P-type MOS transistor 12, and a thick-film transistor 13. The N-type MOS transistor 11 and the P-type MOS transistor 12 constitute the CMOS device used, for example, in a logic circuit. The thick-film transistor 13 is an N-type MOS transistor used, for example, in an input/output (I/O) circuit. Here, a gate insulating film of the thick-film transistor 13 is thicker than a gate insulating film of the N-type MOS transistor in the logic circuit. The thick-film transistor 13 is an N-type MOS transistor in the present embodiment. However, the thick-film transistor 13 may be a P-type MOS transistor.

The N-type MOS transistor 11, the P-type MOS transistor 12, and the thick-film transistor 13 are respectively formed in a first device region 21A, a second device region 21B, and a third device region 21C which are formed in a semiconductor substrate 21 such as silicon (Si) and which are to be active regions. The first device region 21A, the second device region 21B, and the third device region 21C are separate from one another by a device isolation region 22 formed by, for example, shallow trench isolation (STI).

The N-type MOS transistor 11 includes a first gate insulating film 31 and a first gate electrode 32 which are sequentially formed over the first device region 21A having a p well (not shown). On side surfaces of the first gate electrode 32, side walls 33 are provided. In the first device region 21A, first N-type extension regions 34 are provided in portions located to both sides of the first gate electrode 32, and first N-type source/drain regions 35 are provided in portions outside the first N-type extension regions 34.

The P-type MOS transistor 12 includes a second gate insulating film 41 and a second gate electrode 42 which are sequentially formed over the second device region 21B having an n well (not shown). On side surfaces of the second gate electrode 42, side walls 43 are provided. In the second device region 21B, first P-type extension regions 44 are provided in portions located to both sides of the second gate electrode 42, and first P-type source/drain regions 45 are provided in portions outside the first P-type extension regions 44.

The thick-film transistor 13 is an N-type MOS transistor provided with a p well (not shown) formed in the third device region 21C. Over the third device region 21C, a third gate insulating film 51 and a third gate electrode 52 are sequentially formed. On side surfaces of the third gate electrode 52, side walls 53 are provided. In the third device region 21C, second N-type extension regions 54 are provided in portions located to both sides of the third gate electrode 52, and second N-type source/drain regions 55 are provided in portions outside the second N-type extension regions 54.

In the present embodiment, the first gate insulating film 31 of the N-type MOS transistor 11, the second gate insulating film 41 of the P-type MOS transistor 12, and the third gate insulating film 51 of the thick-film transistor 13 are different from one another in thickness. The first gate insulating film 31 is thicker than the second gate insulating film 41. The third gate insulating film 51 is thicker than the first gate insulating film 31. Specific thicknesses depend on the pressure resistance, the threshold voltage, and the like which are to be required. For example, the first gate insulating film 31 is 3 nm and the second gate insulating film 41 is 2 nm, and the third gate insulating film 51 is 7 nm.

The first gate insulating film 31, the second gate insulating film 41, and the third gate insulating film 51 are made of silicon oxynitride (SiON). The first gate insulating film 31 and the second gate insulating film 41 are SiON films which do not have a uniform nitrogen concentration but have different nitrogen concentrations in an upper portion (gate electrode side) and in a lower portion (semiconductor substrate side).

Figure 2A:
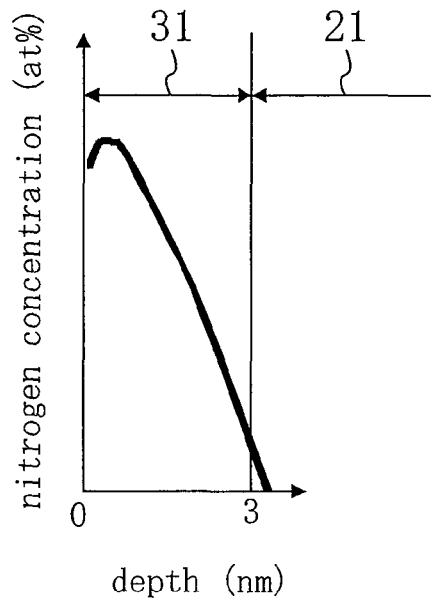
FIGS. 2A and 2B are graphs showing nitrogen concentration profiles respectively of a first gate insulating film and a second gate insulating film of the semiconductor device according to Embodiment 1 of the present invention.
Figure 2B:
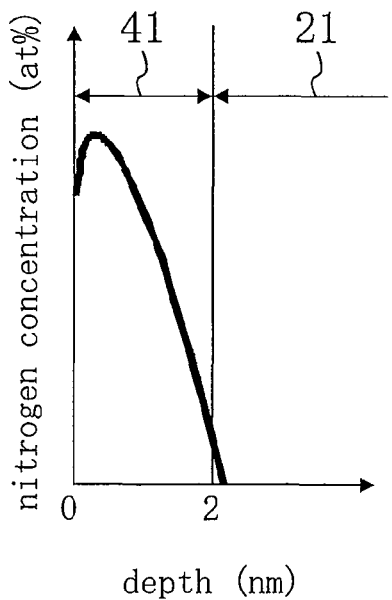

FIGS. 2A and 2B show nitrogen concentration profiles respectively of the first gate insulating film 31 and the second gate insulating film 41. Each of the first gate insulating film 31 and the second gate insulating film 41 has a higher nitrogen concentration in the upper portion and a lower nitrogen concentration in the lower portion.

The first gate insulating film 31 has a nitrogen concentration of between 1 at. % (atomic %) and 3 at. % in the vicinity of an interface to the semiconductor substrate 21, and the second gate insulating film 41 has a nitrogen concentration of between 1 at. % and 3 at. % in the vicinity of an interface to the semiconductor substrate 21. The first gate insulating film 31 and the second gate insulating film 41 have substantially the same nitrogen concentration in the vicinity of the interfaces to the semiconductor substrate 21. However, the first gate insulating film 31 has an average of the nitrogen concentration of between 15 at. % and 30 at. %, the second gate insulating film 41 has an average of the nitrogen concentration of about 8 at. %, and thus the average of the nitrogen concentration is higher in the first gate insulating film 31 than in the second gate insulating film 41.

The N-type MOS transistor preferably has a thick gate insulating film in order to reduce gate leak. Moreover, the gate insulating film preferably has a high nitrogen concentration and a high conductivity so that drivability can be increased. Meanwhile, the gate leak is less likely to occur in the P-type MOS transistor, even if the gate insulating film of the P-type MOS transistor is thinner than the gate insulating film of the N-type MOS transistor. Moreover, the gate insulating film preferably has a not-so-high nitrogen concentration so that drivability can be increased and reliability is improved. In the semiconductor device of the present embodiment, the first gate insulating film 31 of the N-type MOS transistor 11 is a film which is greater in thickness and higher in nitrogen concentration than the second gate insulating film 41, and the second gate insulating film 41 of the P-type MOS transistor 12 is a film which is less in thickness and lower in nitrogen concentration than the first gate insulating film 31. Therefore, the first gate insulating film 31 and the second gate insulating film 41 are gate insulating films which are respectively optimal to the N-type MOS transistor 11 and the P-type MOS transistor 12.

A method for fabricating the semiconductor device according to Embodiment 1 will be described below with reference to the drawings. FIGS. 3A through 3C and FIGS. 4A through 4C illustrate steps of the method for fabricating the semiconductor device of Embodiment 1 in the order of fabrication.

Figure 3A:
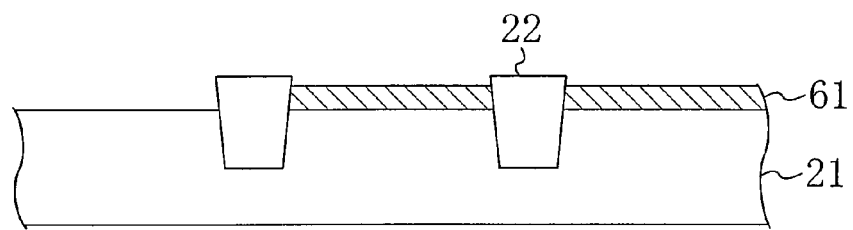
FIGS. 3A through 3C are cross-sectional views illustrating steps of the method for fabricating the semiconductor device according to Embodiment 1 of the present invention in the order of fabrication.

First, as illustrated with FIG. 3A, in a semiconductor substrate 21 such as silicon, a device isolation region 22 is formed by STI to form a first device region 21A, a second device region 21B, and a third device region 21C which are separate from one another. Subsequently, the semiconductor substrate 21 is thermally oxidized to form a thick silicon oxide film 61 having a thickness of 7 nm over the first device region 21A, the second device region 21B, and the third device region 21C. Subsequently, part of the thick silicon oxide film 61 overlying the first device region 21A is selectively removed. The removal of the part of the thick silicon oxide film 61 may be performed by dry etching or wet etching using a photosensitive resist covering part of the thick silicon oxide film 61 over the second device region 21B and over third device region 21C as a mask.

Figure 3B:
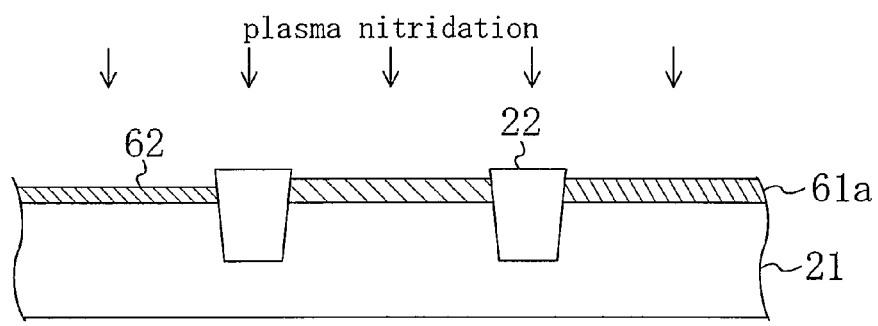

Next, as illustrated with FIG. 3B, a principal surface of the semiconductor substrate 21 is subjected to a first plasma nitridation process. The first plasma nitridation process may be performed under such a condition that the ion energy is between 0.3 eV and 5 eV, and the nitrogen plasma density is greater than or equal to $10^{10}$ cm$^3$. In this case, the process temperature is preferably between about room temperature and about 500° C. By the first plasma nitridation process, the first device region 21A where a surface of the semiconductor substrate 21 is exposed is directly nitrided to form a first silicon nitride film 62 having a thickness of about 2 nm over the first device region 21A. At the same time, nitrogen is also introduced into the part of the thick silicon oxide film 61 over the second device region 21B and the third device region 21C, so that a thick silicon oxynitride film 61a is formed.

Figure 3C:
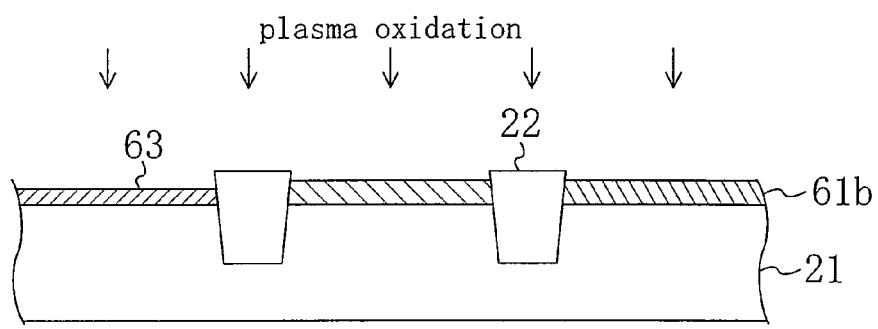

Next, as illustrated with FIG. 3C, the principal surface of the semiconductor substrate 21 is subjected to a first plasma oxidation process. Oxygen is introduced into the first silicon nitride film 62. The first plasma oxidation process may be performed for 20 to 60 seconds under such a condition that dinitrogen monoxide (N$_2$O) plasma is used, the pressure is between 266 Pa (2 Torr) and 666 Pa (5 Torr), and the process temperature is between 900° C. and 1150° C., preferably between 1050° C. and 1100° C.

Figure 5A:
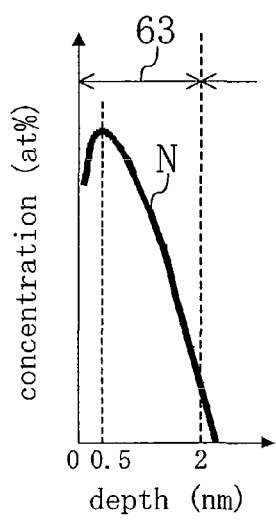
FIGS. 5A through 5C are graphs showing nitrogen concentration profiles of the first gate insulating film in respective steps of the method for fabricating the semiconductor device according to Embodiment 1 of the present invention.

Performing the first plasma oxidation process under such condition causes oxidation at an interface between the first silicon nitride film 62 and the first device region 21A (semiconductor substrate 21). As a result, oxygen is introduced into the first silicon nitride film 62, so that a first silicon oxynitride film 63 having a nitrogen concentration profile as shown in FIG. 5A is formed. The nitrogen concentration of the first silicon oxynitride film 63 reaches a peak at a depth of about 0.5 nm from its surface, and the nitrogen concentration at the peak is between 20 at. % and 80 at. %. At the same time, oxygen is also introduced into the thick silicon oxynitride film 61a over the second device region 21B and the third device region 21C, so that a thick silicon oxynitride film 61b is formed.

Figure 4A:
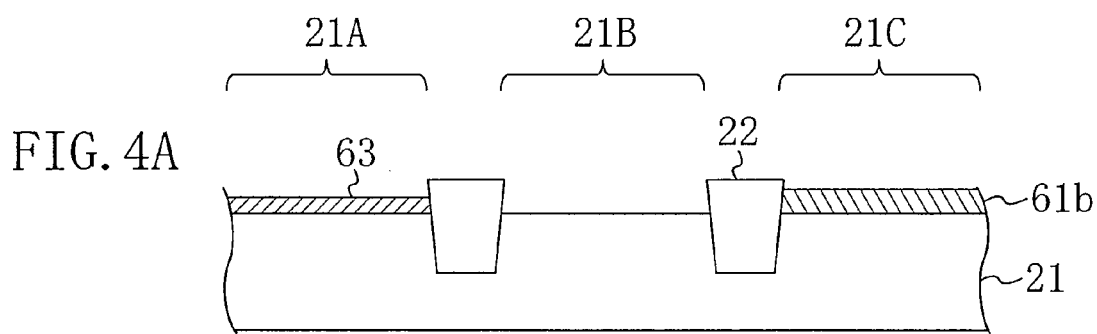
FIGS. 4A through 4C are cross-sectional views illustrating steps of the method for fabricating the semiconductor device according to Embodiment 1 of the present invention in the order of fabrication.

Next, as illustrated with FIG. 4A, part of the thick silicon oxynitride film 61b overlying the second device region 21B is selectively removed by a known method. As a result, a surface of the second device region 21B is exposed. The first silicon oxynitride film 63 remains over the first device region 21A, and part of the thick silicon oxynitride film 61b remains over the third device region 21C.

Figure 4B:
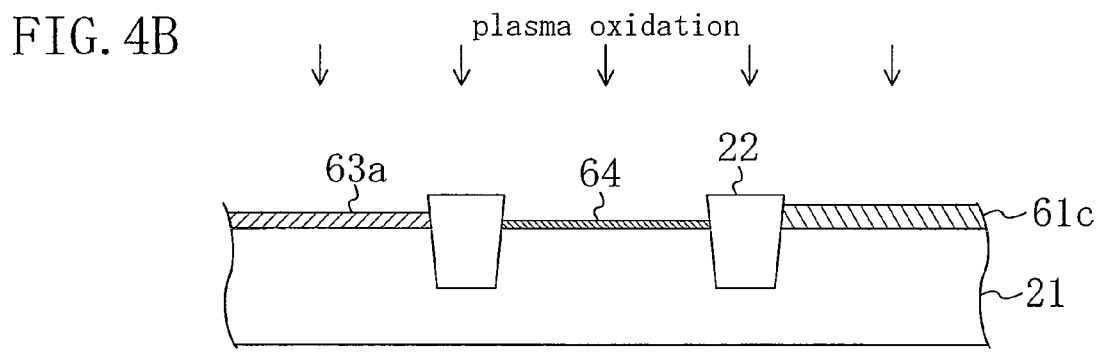
Figure 5B:
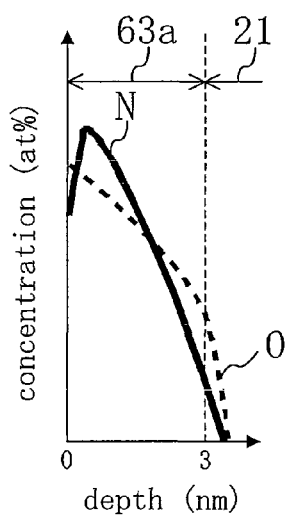

Next, as illustrated with FIG. 4B, the principal surface of the semiconductor substrate 21 is subjected to a second plasma oxidation process to form a first silicon oxide film 64 having a thickness of 2 nm over the second device region 21B. The second plasma oxidation process may be performed by using, for example, inductively coupled plasma (ICP) of oxygen gas. At the same time, oxygen is also introduced into the first silicon oxynitride film 63 over the first device region 21A, so that a first silicon oxynitride film 63a is formed, and oxygen is also introduced into the part of the thick silicon oxynitride film 61b over the third device region 21C, so that a thick silicon oxynitride film 61c is formed. As a result, the nitrogen concentration in an upper portion of the first silicon oxynitride film 63a lowers as shown by a nitrogen concentration profile of FIG. 5B. Moreover, the first silicon oxynitride film 63a comes to have a thickness of about 3 mn. It is to be noted that as an alternative to plasma oxidation, thermal oxidation may be performed.

Figure 4C:
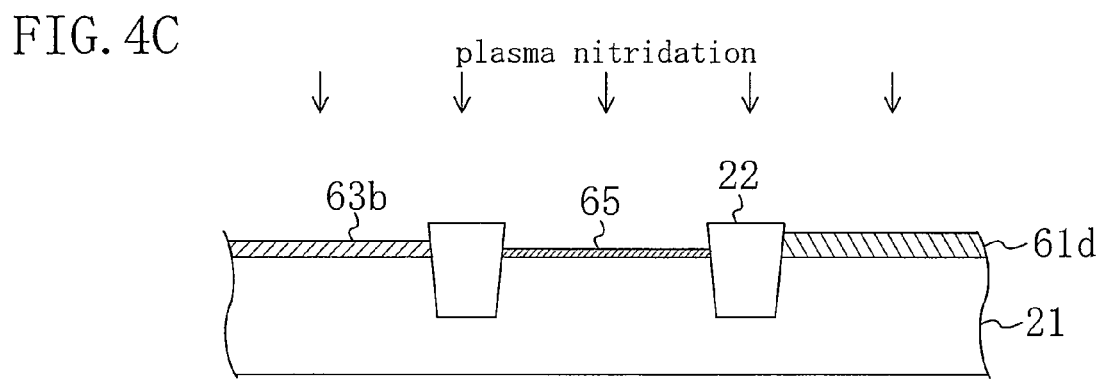
Figure 5C:
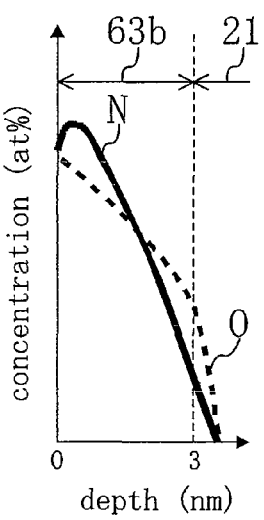

Next, as illustrated with FIG. 4C, the principal surface of the semiconductor substrate 21 is subjected to a second plasma nitridation process to introduce nitrogen into the first silicon oxide film 64 over the second device region 21B. Moreover, a thermal treatment is performed at a temperature of between 800° C. and 1100° C. As a result, over the second device region 21B, a second silicon oxynitride film 65 is formed. At the same time, nitrogen is also introduced into the first silicon oxynitride film 63a over the first device region 21A, so that a first silicon oxynitride film 63b is formed, and oxygen is also introduced into the thick silicon oxynitride film 61c over the third device region 21C, so that a thick silicon oxynitride film 61d is formed. In an upper portion of the first silicon oxynitride film 63b, the nitrogen concentration is increased again as shown by a nitrogen concentration profile of FIG. 5C.

Next, over the entire surface of the semiconductor substrate 21, a polycrystalline silicon film of 100 nm is formed. After that, by adopting photolithography and RIE, the polycrystalline silicon film, the first silicon oxynitride film 63b, the second silicon oxynitride film 65, and the thick silicon oxynitride film 61d are sequentially etched. This results in the formation of an N-type MOS transistor having a first gate insulating film formed by the first silicon oxynitride film 63b and a first gate electrode over the first device region 21A, a P-type MOS transistor having a second gate insulating film formed by the second silicon oxynitride film 65 and a second gate electrode over the second device region 21B, and an N-type thick-film transistor having a third gate insulating film formed by the thick silicon oxynitride film 61d and a third gate electrode over the third device region 21C. It is to be noted that, an N-type impurity is introduced into the gate electrodes of the N-type MOS transistor and the thick-film transistor, and a P-type impurity is introduced into the gate electrode of the P-type MOS transistor.

Moreover, the third gate insulating film of the thick-film transistor is the thick silicon oxynitride film 61d which is formed by performing the first plasma nitridation process, the first plasma oxidation process, the second plasma nitridation process, and the second plasma nitridation process on the thick silicon oxide film 61, and thus influenced by nitridation and oxidation. However, since the thick silicon oxide film 61 which is to be the third gate insulating film is relatively thick, the influence of nitridation and oxidation is small and hardly affects a characteristic of the thick-film transistor.

It is to be noted that the thick silicon oxide film 61 may have a thickness of approximately between 3 nm and 10 nm, the first silicon nitride film 62 may have a thickness of approximately between 0.3 nm and 3 nm, and the first silicon oxide film 64 may have a thickness of approximately between 1 nm and 3 nm.

Variations of Embodiment 1

Figure 6A:
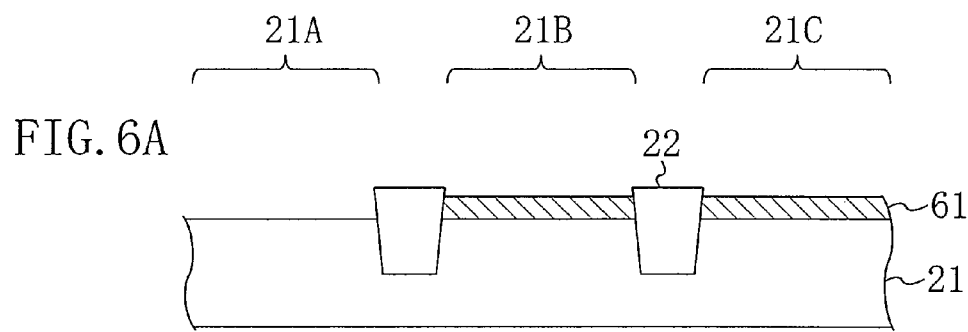
FIGS. 6A through 6C are cross-sectional views illustrating steps of a method for fabricating a semiconductor device according to a variation of Embodiment 1 of the present invention in the order of fabrication.
Figure 6B:
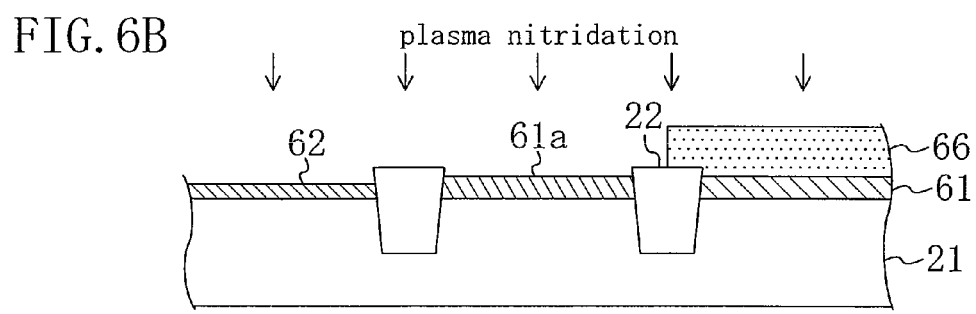
Figure 6C:
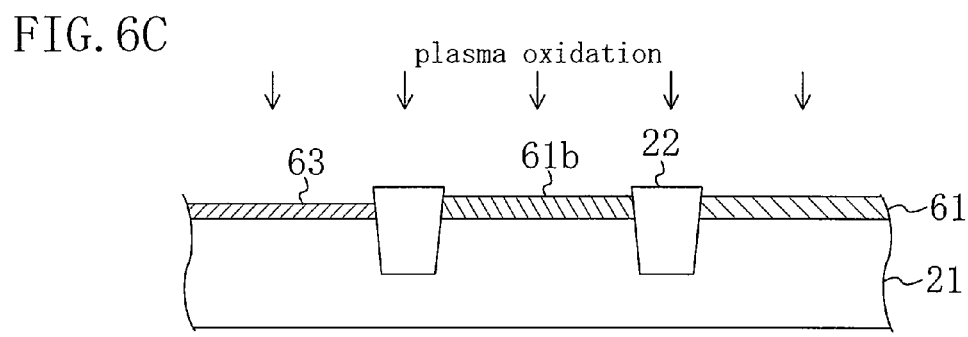

A variation of Embodiment 1 will be described below with reference to the drawings. FIGS. 6A through 6C and FIGS.

7A through 7C illustrate steps of a method for fabricating a semiconductor device according to the variation of Embodiment 1 in the order of fabrication. In FIGS. 6A through 6C and FIGS. 7A through 7C, components being the same as those in FIGS. 3A through 3C and FIGS. 4A through 4C are given the same reference numerals, and descriptions thereof are omitted.

First, as illustrated with FIG. 6A, part of the thick silicon oxide film 61 overlying the first device region 21A is selectively removed in a similar way to the step of FIG. 3A in Embodiment 1.

Next, as illustrated with FIG. 6B, over the semiconductor substrate 21, a first mask 66 is formed by a photosensitive resist. The first mask 66 has an opening over the first device region 21A and the second device region 21B and covers the third device region 21C. After that, a first plasma nitridation process is performed to form a first silicon nitride film 62 over the first device region 21A. At the same time, nitrogen is also introduced into part of the thick silicon oxide film 61 over the second device region 21B, so that a thick silicon oxynitride film 61*a* is formed. The first plasma nitridation process is capable of effectively forming the first silicon nitride film 62 with a low temperature. Therefore, by setting the temperature for the first plasma nitridation process to be lower than or equal to the heat-resistant temperature of the photosensitive resist, the first mask 66 can be used as a mask for the plasma nitridation process. Therefore, it is possible to prevent part of the thick silicon oxide film 61 overlying the third device region 21C from being nitrided. The temperature for the first plasma nitridation process may be determined depending on a material of the photosensitive resist forming the first mask 66, and is preferably lower than or equal to 120° C., and more preferably about 40° C. Since nitrogen is not necessarily introduced into the part of the thick silicon oxide film 61 over the second device region 21B, the second device region 21B may be covered by the first mask 66. In this case, the mask used in the step of FIG. 6A to remove the part of the thick silicon oxide film 61 overlying the first device region 21A may also serve as the first mask 66 covering the second device region 21B and the third device region 21C.

Next, as illustrated with FIG. 6C, a first plasma oxidation process using $N_2O$ gas is performed to introduce oxygen into the first silicon nitride film 62 over the first device region 21A for forming a first silicon oxynitride film 63. At the same time, oxygen is also introduced into the thick silicon oxynitride film 61*a* over the second device region 21B, so that a thick silicon oxynitride film 61*b* is formed.

Figure 7A:
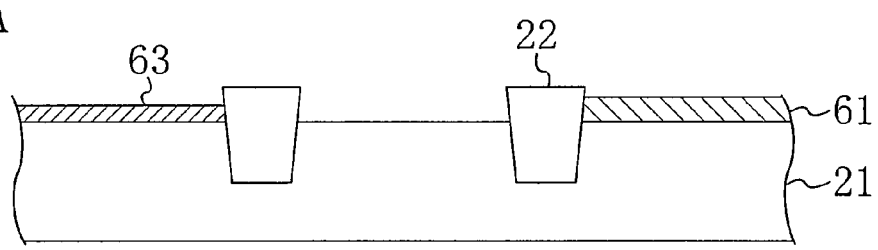
FIGS. 7A through 7C are cross-sectional views illustrating steps of the method for fabricating the semiconductor device according to the variation of Embodiment 1 of the present invention in the order of fabrication.

Next, as illustrated with FIG. 7A, the thick silicon oxide film 61*b* overlying the second device region 21B is removed.

Figure 7B:
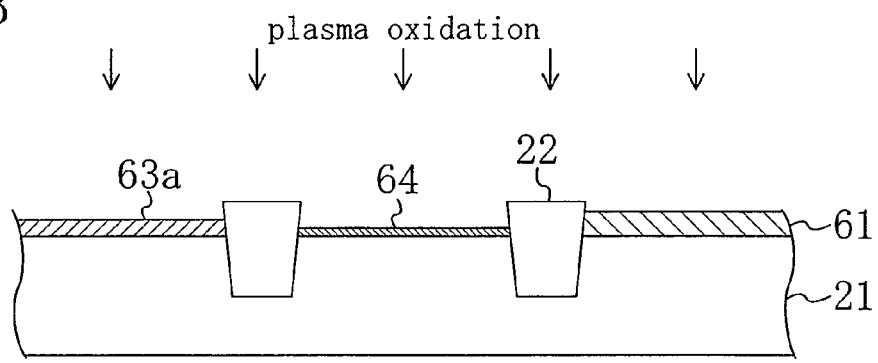

Next, as illustrated with FIG. 7B, a second plasma oxidation process is performed to form a first silicon oxide film 64 over the second device region 21B. At the same time, oxygen is also introduced into the first silicon oxynitride film 63 over the first device region 21A, so that a first silicon oxynitride film 63*a* is formed. It is to be noted that as an alternative to plasma oxidation, thermal oxidation may be performed.

Figure 7C:
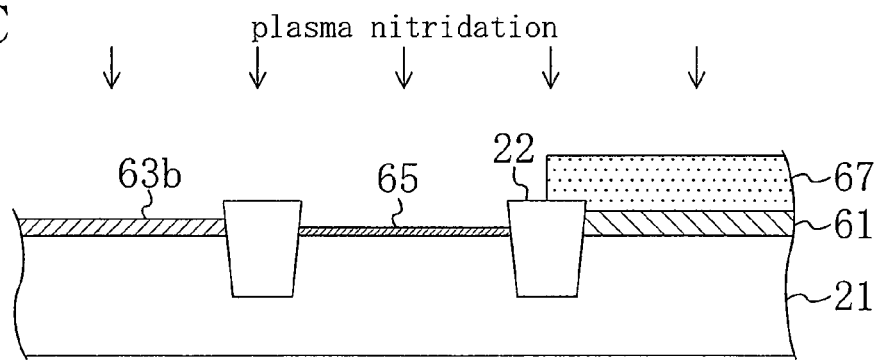

Next, as illustrated with FIG. 7C, a second mask 67 is formed by a photosensitive resist to cover the third device region 21C. Then, a second plasma nitridation process is performed to introduce nitrogen into the first silicon oxide film 64 over the second device region 21B for forming a second silicon oxynitride film 65. At the same time, nitrogen is also introduced into the first silicon oxynitride film 63*a* over the first device region 21A, so that a first silicon oxynitride film 63*b* is formed. The second plasma nitridation process is performed at a temperature lower than or equal to the heat-resistant temperature of the second mask 67. After this, the second mask 67 is removed, and then a thermal treatment is performed at a temperature of between 800° C. and 1100° C.

According to the method for fabricating a semiconductor device of the present variation, the part of the thick silicon oxide film 61 overlying the third device region 21C is not nitrided. Therefore, it is possible to suppress a change in characteristics of the thick-film transistor.

Alternatively, according to characteristics required for the thick-film transistor, the second mask 67 may not be formed, and nitrogen may be introduced into the thick silicon oxide film 61 overlying the third device region 21C.

Embodiment 2

Embodiment 2 of the present invention will be described below with reference to the drawings. FIGS. 8A through 8E illustrate steps of a method for fabricating a semiconductor device according to Embodiment 2 in the order of fabrication. In FIGS. 8A through 8E, components being the same as those in FIGS. 3A through 3C are given the same reference numerals, and descriptions thereof are omitted.

Figure 8A:
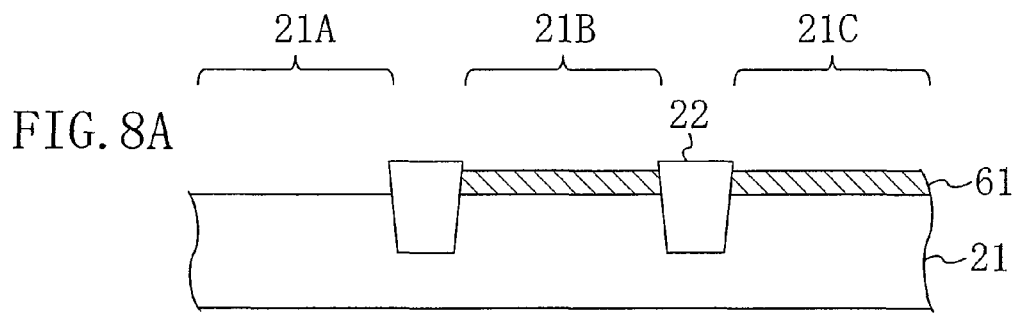
FIGS. 8A through 8E are cross-sectional views illustrating steps of a method for fabricating a semiconductor device according to Embodiment 2 of the present invention in the order of fabrication.

First, as illustrated with FIG. 8A, part of the thick silicon oxide film 61 overlying the first device region 21A is selectively removed as in Embodiment 1.

Figure 8B:
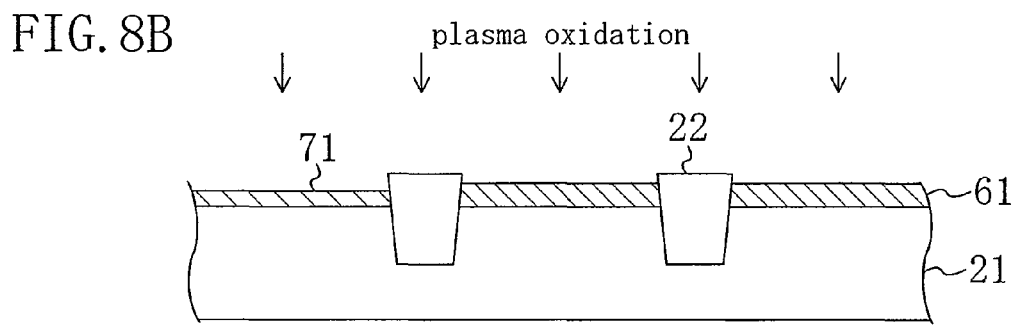

Next, as illustrated with FIG. 8B, a first plasma oxidation process is performed to form a first silicon oxide film 71 having a thickness of 2 nm over the first device region 21A. It is to be noted that as an alternative to plasma oxidation, thermal oxidation may be performed. Here, the first silicon oxide film 71 preferably has a thickness of between 1 nm and 3 nm.

Figure 8C:
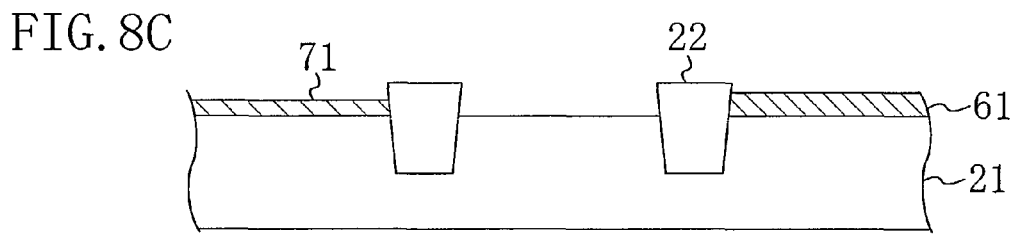

Next, as illustrated with FIG. 8C, part of the thick silicon oxide film 61 overlying the second device region 21B is selectively removed, so that a surface of the second device region 21B is exposed. Here, over the first device region 21A, the first silicon oxide film 71 remains, and over the third device region 21C, part of the thick silicon oxide film 61 remains.

Figure 8D:
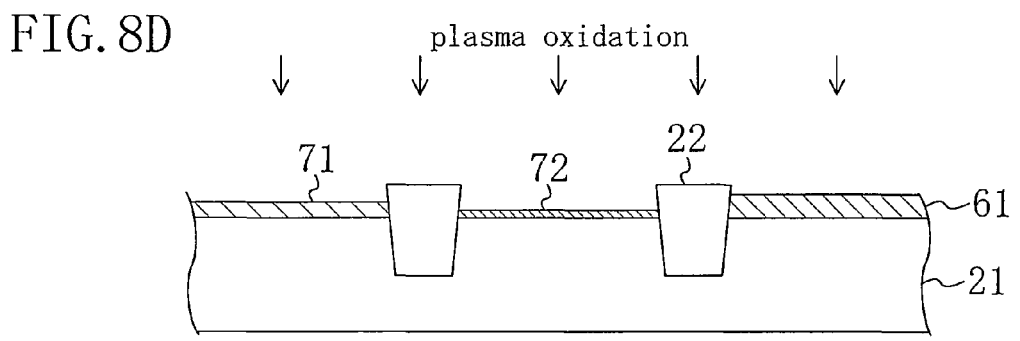

Next, as illustrated with FIG. 8D, a second plasma oxidation process is performed to form a second silicon oxide film 72 over the second device region 21B. The second silicon oxide film 72 has a thickness (for example, 1.8 nm) thinner than the first silicon oxide film 71. It is to be noted that the second silicon oxide film 72 may be formed by thermal oxidation.

Figure 8E:
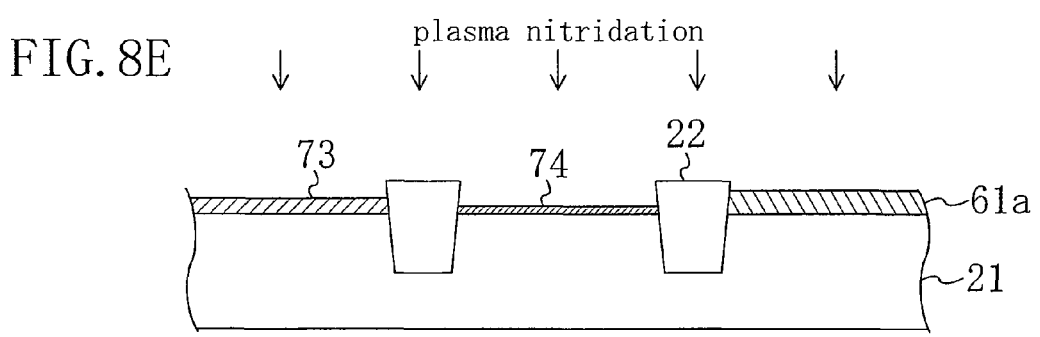
Figure 9A:
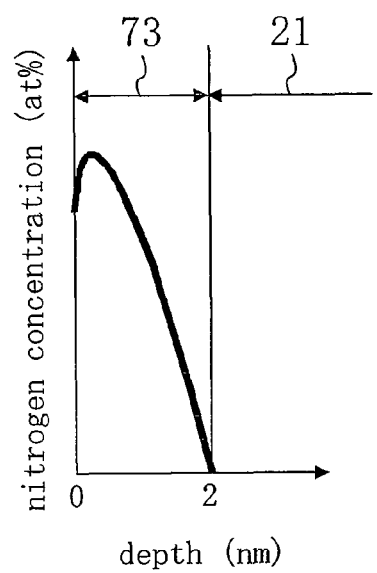
FIGS. 9A and 9B are graphs showing nitrogen concentration profiles respectively of a first gate insulating film and a second gate insulating film of the semiconductor device according to Embodiment 2 of the present invention.
Figure 9B:
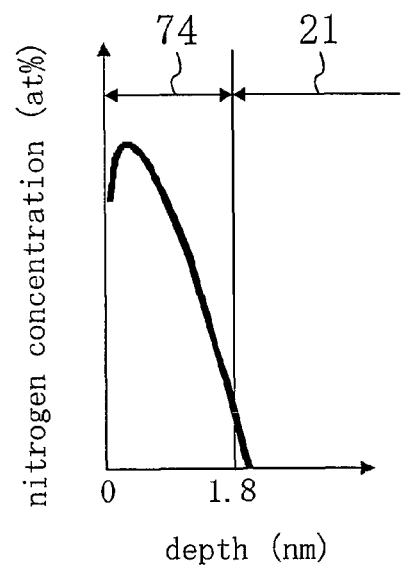

Next, as illustrated with FIG. 8E, a plasma nitridation process is performed to introduce nitrogen into the first silicon oxide film 71 over the first device region 21A and the second silicon oxide film 72 over the second device region 21B. At the same time, the nitrogen is introduced also into the part of thick silicon oxide film 61 over the third device region 21C. Moreover, a thermal treatment is performed at a temperature of between 800° C. and 1100° C. As a result, it is possible to obtain a first silicon oxynitride film 73 having a nitrogen concentration profile of FIG. 9A and a second silicon oxynitride film 74 having a nitrogen concentration profile of FIG. 9B. At the same time, over the third device region 21C, a thick silicon oxynitride film 61*a* is formed. Due to the simultaneous introduction of nitrogen by the plasma nitridation process, the first silicon oxynitride film 73 and the second silicon oxynitride film 74 have substantially the same average of the nitrogen concentration, which is, for example, about 8 at. %.

According to the method for fabricating the semiconductor device of the present embodiment, it is possible that the second gate insulating film (second silicon oxynitride film 74) of the P-type MOS transistor is thinner than the first gate insulating film (first silicon oxynitride film 73) of the N-type MOS transistor. Therefore, it is possible to improve the performance especially of the P-type MOS transistor.

Note that, as illustrated with the variation of Embodiment 1, the part of the thick silicon oxide film 61 overlying the third device region 21C may be covered by a mask in the plasma nitridation process in the step illustrated with FIG. 8E to prevent the nitrogen from being introduced thereinto.

Embodiment 3

Embodiment 3 of the present invention will be described below with reference to the drawings. FIGS. 10A through 10E illustrate steps of a method for fabricating a semiconductor device according to Embodiment 3 in the order of fabrication. In FIG. FIGS. 10A through 10E, components being the same as those in FIGS. 3A through 3C are given the same reference numerals, and descriptions thereof are omitted.

First, as illustrated with FIG. 10A, after the thick silicon oxide film 61 is formed over the semiconductor substrate 21 in a similar way to that described in Embodiment 1, part of the thick silicon oxide film 61 overlying the first device region 21A and the second device region 21B is removed, and part of the thick silicon oxide film 61 is left over the third device region 21C.

Next, as illustrated with FIG. 10B, a thermal oxidation or plasma oxidation process is performed to form a first silicon oxide film 71 having a thickness of 2 nm over the first device region 21A and the second device region 21B. Here, the first silicon oxide film 71 preferably has a thickness of between 1 nm and 3 nm.

Next, as illustrated with FIG. 10C, the second device region 21B and the third device region 21C are covered by a first mask 76 formed by a photosensitive resist. Then, a first plasma nitridation process is performed to introduce nitrogen into part of the first silicon oxide film 71 over the first device region 21A for forming a first silicon oxynitride film 73. After that, the first mask 76 is removed. The first plasma nitridation process is performed for 90 to 120 seconds under such a condition that nitrogen plasma is used, the power is 2000 W, and the pressure is lower than or equal to 7 Pa, which is a low pressure. The process temperature in this case is lower than or equal to the heat-resistant temperature of the photosensitive resist, preferably lower than or equal to 120° C., and more preferably lower than or equal to 40° C.

Next, as illustrated with FIG. 10D, the first mask 76 is removed, and then the first device region 21A and the third device region 21C are covered by a second mask 77 formed by a photosensitive resist. Then, a second plasma nitridation process is performed to introduce nitrogen into part of the first silicon oxide film 71 over the first device region 21B for forming a second silicon oxynitride film 74. The second plasma nitridation process is performed for 20 to 40 seconds under such a condition that nitrogen plasma is used, the power is 2000 W, and the pressure is lower than or equal to 7 Pa, which is a low pressure. The process temperature in this case is lower than or equal to the heat-resistant temperature of the photosensitive resist, preferably lower than or equal to 120° C., and more preferably lower than or equal to 40° C. Therefore, the amount of nitrogen introduced into the second silicon oxynitride film 74 is smaller than that of nitrogen introduced into the first silicon oxynitride film 73 because the processing time is short.

Figure 11A:
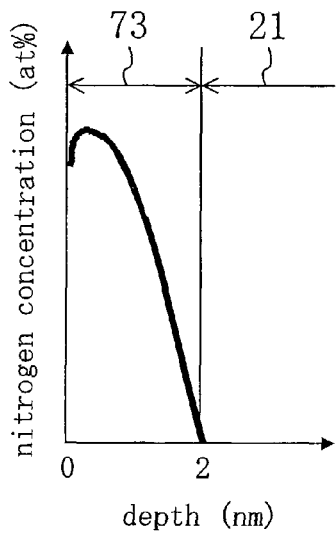
FIGS. 11A and 11B are graphs showing nitrogen concentration profiles respectively of a first gate insulating film and a second gate insulating film of the semiconductor device according to Embodiment 3 of the present invention.
Figure 11B:
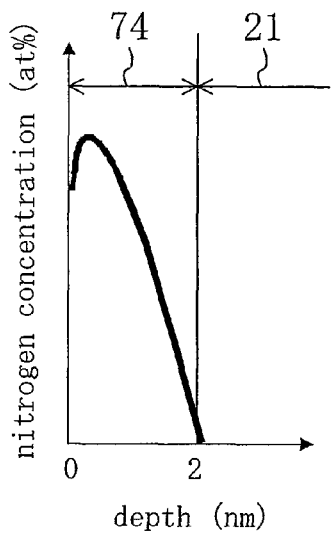

Next, as illustrated with FIG. 10E, the second mask 77 is removed, and then a thermal process is performed at a temperature of between 800° C. and 1100° C. As a result, it is possible to obtain a first silicon oxynitride film 73 and a second silicon oxynitride film 74 having nitrogen concentration profiles of FIG. 11. The first silicon oxynitride film 73 has an average of the nitrogen concentration of between 15 at. % and 18 at. %, the second silicon oxynitride film 74 has an average of the nitrogen concentration of between 8 at. % and 12 at. %, and thus the average of the nitrogen concentration is higher in the first silicon oxynitride film 73 than in the second silicon oxynitride film 74.

According to the method for fabricating the semiconductor device of the present embodiment, it is possible that the nitrogen concentration of the first gate insulating film (first silicon oxynitride film 73) of the N-type MOS transistor is higher than that of the second gate insulating film (second silicon oxynitride film 74) of the P-type MOS transistor. Therefore, it is possible to improve the performance especially of the N-type MOS transistor.

It is to be noted that, at least in one of the first plasma nitridation process and the second plasma nitridation process, the part of the thick silicon oxide film 61 overlying the third device region 21C may not be covered by the mask, so that nitrogen is introduced thereinto.

Figure 12A:
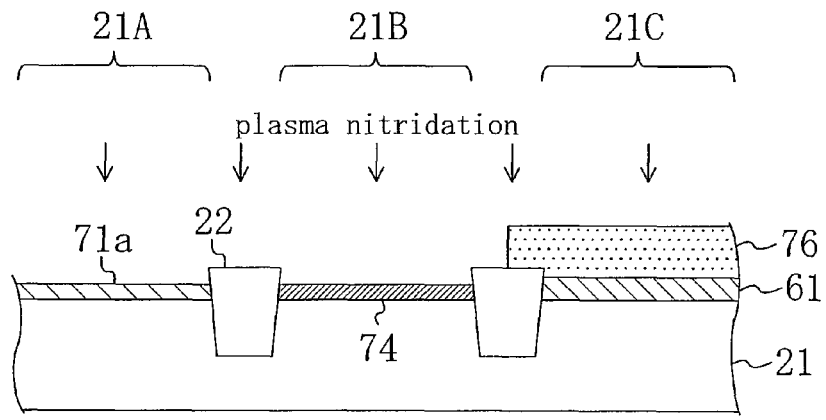
FIGS. 12A and 12B are cross-sectional views illustrating steps of a variation of the method for fabricating the semiconductor device according to Embodiment 3 of the present invention in the order of fabrication.
Figure 12B:
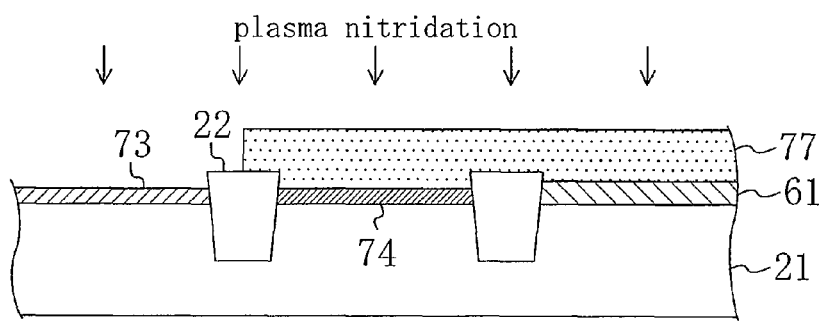

As an alternative to the processes illustrated with FIGS. 10C and 10D, processes illustrated with FIGS. 12A and 12B may be performed. In this case, as illustrated with FIG. 12A, a first mask 76 having an opening over the first device region 21A and the second device region 21B and covering the third device region 21C is formed, and then a first plasma nitridation process is performed. At this time, nitrogen is introduced into the part of the first silicon oxide film 71 over the second device region 21B to form a second silicon oxynitride film 74 having a desired nitrogen concentration. At the same time, nitrogen is introduced into the part of the first silicon oxide film 71 over the first device region 21A to form an intermediate silicon oxynitride film 71a. At this moment, the intermediate silicon oxynitride film 71a has substantially the same nitrogen concentration as that of the second silicon oxynitride film 74.

Subsequently, as illustrated with FIG. 12B, a second mask 77 is formed. The second mask 77 has an opening over the first device region 21A and covers the second device region 21B and the third device region 21C. Then, a second plasma nitridation process is performed. This further introduces nitrogen into the intermediate silicon oxynitride film 71a to form a first silicon oxynitride film 73 having a desired nitrogen concentration.

Embodiment 4

Embodiment 4 of the present invention will be described below with reference to the drawings. FIGS. 13A through 13E illustrate steps of a method for fabricating a semiconductor device according to Embodiment 4 in the order of fabrication. In FIGS. 13A through 13E, components being the same as those in FIGS. 3A through 3C are given the same reference numerals, and descriptions thereof are omitted.

First, as illustrated with FIG. 13A, part of the thick silicon oxide film 61 overlying the first device region 21A is removed in a similar way to the step illustrated with FIG. 3A in Embodiment 1.

Next, as illustrated with FIG. 13B, a first plasma oxidation process is performed to form a first silicon oxide film 71 having a thickness of 2 nm over the first device region 21A. Here, the first silicon oxide film 71 preferably has a thickness of between 1 mn and 3 nm. It is to be noted that as an alternative to plasma oxidation, thermal oxidation may be performed.

Next, part of the thick silicon oxide film 61 overlying the second device region 21B is selectively removed. Subsequently, as illustrated with FIG. 13C, a second plasma oxidation process is performed to form a second silicon oxide film 72 over the second device region 21B. The second silicon oxide film 72 has a thickness (for example, 1.8 nm) thinner than the first silicon oxide film 71. It is to be noted that as an alternative to plasma oxidation, thermal oxidation may be performed.

Next, as illustrated with FIG. 13D, the second device region 21B and the. third device region 21C are covered by a first mask 76 formed by a photosensitive resist, and then a first plasma nitridation process is performed to introduce nitrogen into the first silicon oxide film 71 over the first device region 21A for forming a first silicon oxynitride film 73. The first plasma nitridation process is performed under such a condition that nitrogen plasma is used, the power is 2000 W, the pressure is lower than or equal to 7 Pa, which is a low pressure, and processing time is 90 to 120 seconds. The process temperature is lower than or equal to the heat-resistant temperature of the photosensitive resist, preferably lower than or equal to 120° C., and more preferably about 40° C.

Next, as illustrated with FIG. 13E, the first device region 21A and the third device region 21C are covered by a second mask 77 formed by a photosensitive resist, and then a second plasma nitridation process is performed to introduce nitrogen into the second silicon oxide film 72 over the second device region 21B for forming a second silicon oxynitride film 74. The second plasma nitridation process is performed under such a condition that nitrogen plasma is used, the power is 2000 W, the pressure is lower than or equal to 7 Pa, which is a low pressure and the processing time is 20 to 40 seconds. The process temperature is lower than or equal to the heat-resistant temperature of the photosensitive resist, preferably lower than or equal to 120° C., and more preferably about 40° C. Therefore, the amount of nitrogen introduced into the second silicon oxynitride film 74 is smaller than that of nitrogen introduced into the first silicon oxynitride film 73 because the processing time is short. Next, the second mask 77 is removed, and then a thermal process is performed at a temperature of between 800° C. and 1100° C. The first silicon oxynitride film 73 has an average of the nitrogen concentration of between 15 at. % and 18 at. %, the second silicon oxynitride film 74 has an average of the nitrogen concentration of between 8 at. % and 12 at. %, and thus the average of the nitrogen concentration is higher in the first silicon oxynitride film 73 than in the second silicon oxynitride film 74.

According to the method for fabricating the semiconductor device of the present embodiment, it is possible that the nitrogen concentration of the first gate insulating film (first silicon oxynitride film 73) of the N-type MOS transistor is higher than that of the second gate insulating film (second silicon oxynitride film 74) of the P-type MOS transistor and that the thickness of the second gate insulation film is less than that of the first gate insulating film. Therefore, it is possible to improve the performance of the N-type MOS transistor and the P-type MOS transistor.

It is to be noted that, at least in one of the first plasma nitridation process and the second plasma nitridation process, part of the thick silicon oxide film 61 overlying the third device region 21C may not be covered by the mask, so that nitrogen is introduced thereinto.

Figure 14A:
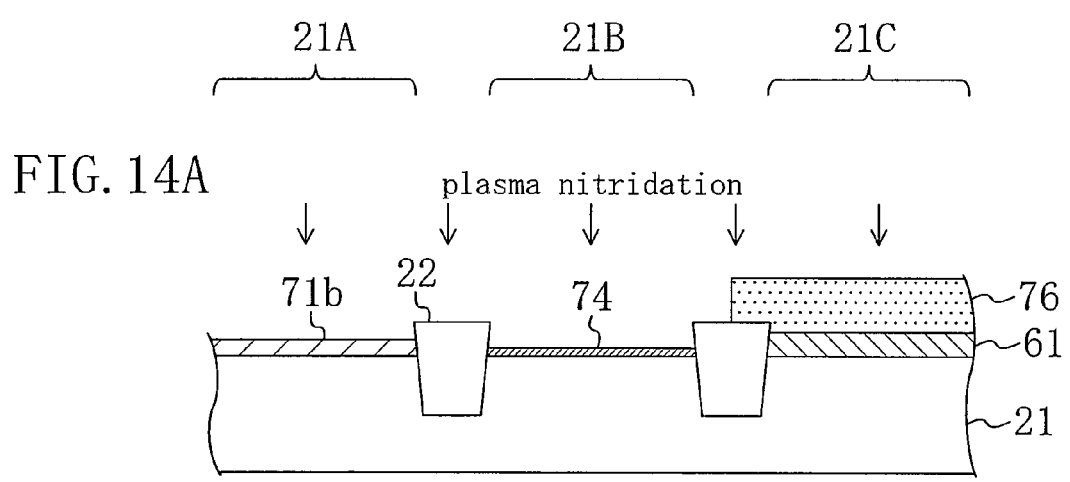
FIGS. 14A and 14B are cross-sectional views illustrating steps of a variation of the method for fabricating the semiconductor device according to Embodiment 4 of the present invention in the order of fabrication.
Figure 14B:
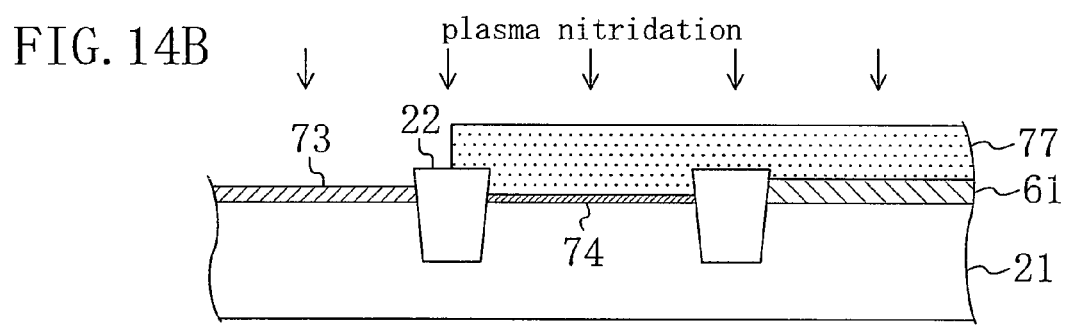
Figure 16A:
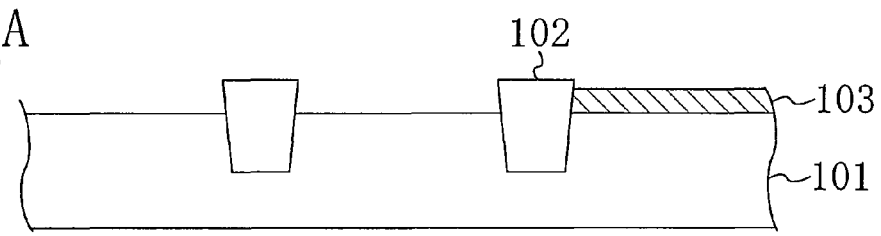
FIGS. 16A through 16C are cross-sectional views illustrating a conventional method for fabricating a semiconductor device in the order of fabrication.
Figure 16B:
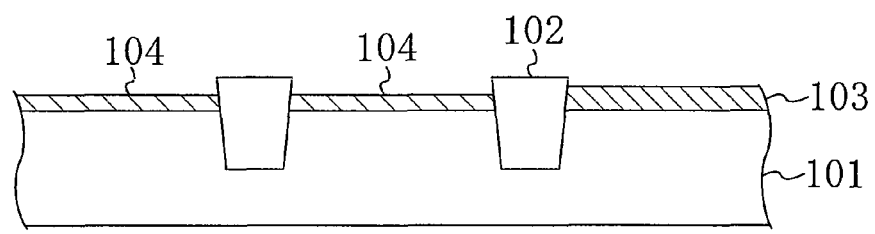
Figure 16C:
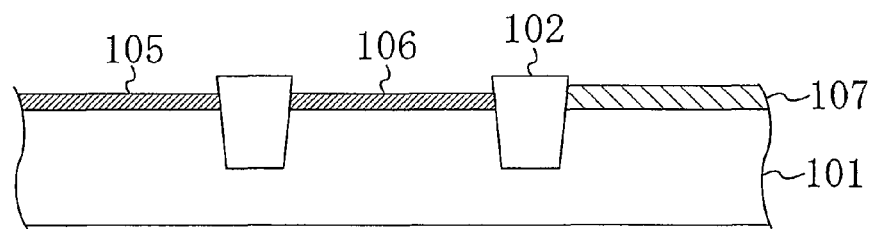

As an alternative to the processes illustrated with FIGS. 13D and 13E, processes illustrated with FIGS. 14A and 14B may be performed. In this case, as illustrated with FIG. 14A, a first mask 76 having an opening over the first device region 21A and the second device region 21B and covering the third device region 21C is formed, and then a first plasma nitridation process is performed. At this time, nitrogen is introduced into the second silicon oxide film 72 over the second device region 21B to form a second silicon oxynitride film 74 having a desired nitrogen concentration. At the same time, nitrogen is introduced into the first silicon oxide film 71 over the first device region 21A to form an intermediate silicon oxynitride film 71b. At this moment, the intermediate silicon oxynitride film 71b has substantially the same nitrogen concentration as that of the second silicon oxynitride film 74. Subsequently, as illustrated with FIG. 14B, a second mask 77 covering the second device region 21B and the third device region 21C is formed, and then a second plasma nitridation process is performed. This further introduces nitrogen into the intermediate silicon oxynitride film 71b to form a first silicon oxynitride film 73 having a higher average of the nitrogen concentration than the second silicon oxynitride film 74.

Embodiment 5

Embodiment 5 of the present invention will be described below with reference to the drawings. FIGS. 15A through 15E illustrate steps of a method for fabricating a semiconductor device according to Embodiment 5 in the order of fabrication. In FIGS. 15A through 15E, components being the same as those in FIGS. 3A through 3C are given the same reference numerals, and descriptions thereof are omitted.

First, as illustrated with FIG. 15A, part of the thick silicon oxide film 61 overlying the first device region 21A is removed in a similar way to the step illustrated with FIG. 3A in Embodiment 1.

Next, as illustrated with FIG. 15B, a first plasma oxidation process is performed to form a first silicon oxide film 71 having a thickness of 2 nm over the first device region 21A. Here, the first silicon oxide film 71 preferably has a thickness of between 1 nm and 3 nm. It is to be noted that as an alternative to plasma oxidation, thermal oxidation may be performed.

Next, as illustrated with FIG. 15C, the second device region 21B and the third device region 21C are covered by a first mask 76 formed by a photosensitive resist, and then a first plasma nitridation process is performed to introduce nitrogen into the first silicon oxide film 71 over the first device region 21A for forming a first silicon oxynitride film 73. The first plasma nitridation process is performed for 90 to 120 seconds under such a condition that nitrogen plasma is used, the power is 2000 W, and the pressure is lower than or equal to 7 Pa, which is a low pressure. The process temperature is lower than or equal to the heat-resistant temperature of the photosensitive resist, preferably lower than or equal to 120° C., and more preferably about 40° C.

Next, the first mask 76 is removed, and then part of the thick silicon oxide film 61 overlying the second device region 21B is selectively removed. Subsequently, as illustrated with FIG. 15D, a second plasma oxidation process is performed to form a second silicon oxide film 72 over the second device region 21B. The second silicon oxide film 72 has a thickness (for example, 1.8 nm) thinner than the first silicon oxide film 71. It is to be noted that as an alternative to plasma oxidation, thermal oxidation may be performed.

Next, as illustrated with FIG. 15E, after the first device region 21A and the third device region 21C are covered by a second mask 77 formed by a photosensitive resist, a second plasma nitridation process is performed to introduce nitrogen into the second silicon oxide film 72 over the second device region 21B for forming a second silicon oxynitride film 74. The second plasma nitridation process is performed for 20 to 40 seconds under such a condition that nitrogen plasma is used, the power is 2000 W, and the pressure is lower than or equal to 7 Pa, which is a low pressure. The process temperature is lower than or equal to the heat-resistant temperature of the photosensitive resist, preferably lower than or equal to 120° C., and more preferably about 40° C. Therefore, the amount of nitrogen introduced into the second silicon oxynitride film 74 is smaller than that of nitrogen introduced into the first silicon oxynitride film 73 because the processing time is short. Next, the second mask 77 is removed, and then a thermal process is performed at a temperature of between 800° C. and 1100° C. The first silicon oxynitride film 73 has an average of the nitrogen concentration of between 15 at. % and 18 at. %, the second silicon oxynitride film 74 has an average of the nitrogen concentration of between 8 at. % and 12 at. %, and thus the average of the nitrogen concentration is higher in the first silicon oxynitride film 73 than in the second silicon oxynitride film 74.

According to the method for fabricating the semiconductor device of the present embodiment, it is possible that the nitrogen concentration of the first gate insulating film (first silicon oxynitride film 73) of the N-type MOS transistor is higher than that of the second gate insulating film (second silicon oxynitride film 74) of the P-type MOS transistor and that the thickness of the second gate insulation film is less than that of the first gate insulating film. Therefore, it is possible to improve the performance of the N-type MOS transistor and the P-type MOS transistor.

Although the second device region 21B and the third device region 21C are covered by the first mask 76 during the first plasma nitridation process, the first mask 76 may not be necessarily required. Moreover, for the second plasma nitridation process, the second mask 77 may not be necessarily formed over the third device region 21C.

Embodiments and the variations refer examples in which the thick-film transistor is an N-type MOS transistor, but the thick-film transistor may be either N-type or P-type. Moreover, the thick-film transistor is not necessarily provided.

Although it has been described that the first gate insulating film and the second gate insulating film are as a whole made of silicon oxynitride containing silicon, oxygen, and nitrogen. However, part made of silicon nitride without containing oxygen or part made of silicon oxide without containing nitrogen may exist.

As described above, according to the semiconductor device and the method for fabricating the same of the present invention, it is possible to realize a semiconductor device in which the N-type MOS transistor and P-type MOS transistor have gate insulating films respectively with optimal characteristics and which has high drivability and high reliability. The semiconductor device and the method for fabricating the same of the present invention are especially applicable to a CMOS device and a method for fabricating the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
a first transistor having a first gate insulating film formed on a first device region of a semiconductor substrate and a first gate electrode formed on the first gate insulating film, the first gate insulating film being made of silicon oxynitride;
a second transistor having a second gate insulating film formed on a second device region of the semiconductor substrate and a second gate electrode formed on the second gate insulating film, the second gate insulating film being made of silicon oxynitride; and
a third transistor having a third gate insulating film formed on a third device region of the semiconductor substrate and a third gate electrode formed on the third gate insulating film,
wherein an average of a nitrogen concentration is higher in the first gate insulating film than in the second gate insulating film,
the first transistor and the third transistor are N-type MOS transistors,
the second transistor is a P-type MOS transistor, and
the first gate insulating film has a physical thickness greater than the second gate insulating film and smaller than the third gate insulating film.

2. The semiconductor device of claim 1, wherein the first gate insulating film has a higher peak value of the nitrogen concentration than the second gate insulating film.

3. The semiconductor device of claim 1, wherein the nitrogen concentration at an interface between the first gate insulating film and the semiconductor substrate is substantially the same as that at an interface between the second gate insulating film and the semiconductor substrate.

4. The semiconductor device of claim 3, wherein
the nitrogen concentration at the interface between the first gate insulating film and the semiconductor substrate is between about 1 at. % and 3 at. %, and
the nitrogen concentration at the interface between the second gate insulating film and the semiconductor substrate is between about 1 at. % and 3 at. %.

5. The semiconductor device of claim 1, wherein the third gate insulating film is made of silicon oxide or silicon oxynitride.

6. The semiconductor device of claim 1, wherein
the average of the nitrogen concentration in the first gate insulating film is between about 15 at. % and 18 at. %, and
the average of the nitrogen concentration in the second gate insulating film is between about 8 at. % and 12 at. %.

7. A semiconductor device comprising:
a first transistor having a first gate insulating film formed on a first device region of a semiconductor substrate and a first gate electrode formed on the first gate insulating film, the first gate insulating film being made of silicon oxynitride;
a second transistor having a second gate insulating film formed on a second device region of the semiconductor substrate and a second gate electrode formed on the second gate insulating film, the second gate insulating film being made of silicon oxynitride; and
a third transistor having a third gate insulating film formed on a third device region of the semiconductor substrate and a third gate electrode formed on the third gate insulating film,
wherein the first gate insulating film has a physical thickness greater than the second gate insulating film and smaller than the third gate insulating film, an average of a nitrogen concentration in the first gate insulating film is substantially the same as that in the second gate insulating film, the first transistor and the third transistor are N-type MOS transistors, and the second transistor is a P-type MOS transistor.

8. The semiconductor device of claim 7, wherein a nitrogen concentration is lower at an interface between the first gate insulating film and the semiconductor substrate than at an interface between the second gate insulating film and the semiconductor substrate.

9. The semiconductor device of claim 7, wherein the first gate insulating film has a higher peak value of a nitrogen concentration than the second gate insulating film.

* * * * *